United States Patent [19]
Chen et al.

[11] Patent Number: 5,920,583
[45] Date of Patent: Jul. 6, 1999

[54] DUAL LASER WITH THERMOELECTRIC COOLING

[75] Inventors: Chan-Chih David Chen, Emmaus; Jean-Marc Pierre Delavaux, Wescosville; Stephen Walter Granlund, Lower Macungie Township; Sun-Yuan Huang, Maidencreek Township; Khanh Cong Nguyen, Whitehall Township; Katherine Anne Yanushefski, Hereford, all of Pa.

[73] Assignee: Lucent Technologies Inc., Murray Hill, N.J.

[21] Appl. No.: 08/200,044

[22] Filed: Feb. 22, 1994

[51] Int. Cl.[6] .................................................. H01S 3/04
[52] U.S. Cl. ................................. 372/34; 372/38
[58] Field of Search ................... 372/34–36, 38; 363/89

[56] References Cited

U.S. PATENT DOCUMENTS

| | | | |
|---|---|---|---|
| 4,571,728 | 2/1986 | Yoshikawa | 372/36 |
| 4,683,573 | 7/1987 | Albanese | 372/34 |
| 5,105,429 | 4/1992 | Mundinger et al. | 372/36 |
| 5,371,665 | 12/1994 | Quisenberry et al. | 363/89 |

*Primary Examiner*—Leon Scott, Jr.
*Attorney, Agent, or Firm*—R. D. Laumann

[57] ABSTRACT

A laser module uses series connected thermoelectric coolers to maintain lasers at the proper operating temperature. A variable resistance associated with the thermoelectric cooler is adjusted to maintain the current through the cooler at the proper value.

12 Claims, 1 Drawing Sheet

ND THERMOELECTRIC COOLING

DUAL LASER WITH THERMOELECTRIC COOLING

TECHNICAL FIELD

This invention relates generally to the field of dual lasers including the field of cooled dual pump lasers.

BACKGROUND OF THE INVENTION

Optical communications systems using optical fibers to convey information between a light source and a light detector are presently of significant and growing commercial interest. The light source used in such systems is commonly a semiconductor laser. Characteristics of the semiconductor laser, such as emission wavelength, that are important for system operation are functions of the laser temperature. However, the current flowing through the laser to produce radiation also produces heating of the laser which is frequently because it, for example, shifts the emission wavelength. Accordingly, techniques have been developed to cool the lasers so that they may be operated at a constant temperature. Perhaps the most prevalently used technique at the present time to maintain the laser temperature is thermoelectric cooling. This technique is well known to those skilled in the art and need not be further described.

Initial optical communications systems used repeaters to span long distances. The repeaters detected and then regenerated optical signal. However, complex electronics are required for detection and regeneration. A conceptually simpler and more recently developed technique uses optical amplifiers to span long distances. The most commonly used optical amplifiers have a segment of a rare earth doped length of optical fiber which is pumped by a pump laser. The doped segment of optical fiber amplifies the incoming optical signal and emits an amplified optical signal. An exemplary dopant is erbium and erbium doped fiber amplifiers are often referred to by the acronym EDFA.

The frequency of the pump laser is also an important system parameter and the pump lasers used in the fiber amplifiers are often cooled with thermoelectric coolers. The fiber amplifiers may be remotely situated and reducing power consumption is desirable. Of course, the thermoelectric cooler also consumes power. Many fiber amplifier packages or modules have dual pump lasers. These modules must have both lasers cooled and power must be supplied to the thermoelectric cooler. The degree of precision required for temperature control mandates precise control of the currents through the each laser. This control has been obtained by using parallel connected thermoelectric coolers. This configuration permits easy control of the thermoelectric coolers but has high power consumption which is undesirable because it requires use of big power supplies, a bulky heat sink, or specially manufactured printed circuit boards to remove the heat from the components of the module.

It is also recognized that control of the current through the laser is critical as it is for the cooling apparatus.

SUMMARY OF THE INVENTION

According to an exemplary embodiment of this invention, a laser module has first and second lasers and first and second series connected devices such as cooling apparatus. The first and second lasers are mounted with the first and second cooling apparatus, respectively. The module further has first and second variable resistances which are connected in parallel with the first and second cooling apparatus, respectively. There is switch connected to the first thermoelectric cooler and which can be connected to at least two voltage sources. A microcontroller connected to the switch and to the first and second variable resistances receives information from the first and second variable resistances, processes the information, and changes the variable resistances so that the currents through the cooling apparatus are the desired values. In one embodiment, at least one of the first and second variable resistances has series connected shunt and monitor resistances. Both the first and second variable resistance may have series connected shunt and monitor resistances. The module also have a third monitor resistance connected to the second thermoelectric cooler and to a ground connection. In a preferred embodiment, the lasers are semiconductor lasers. In another preferred embodiment, the cooling apparatus is formed by thermoelectric coolers. In yet another preferred embodiment, first and second voltage sources are connected to the switch.

BRIEF DESCRIPTION OF THE DRAWING

Identical numerals in different FIGURES represent identical elements.

DETAILED DESCRIPTION

Figure 1:
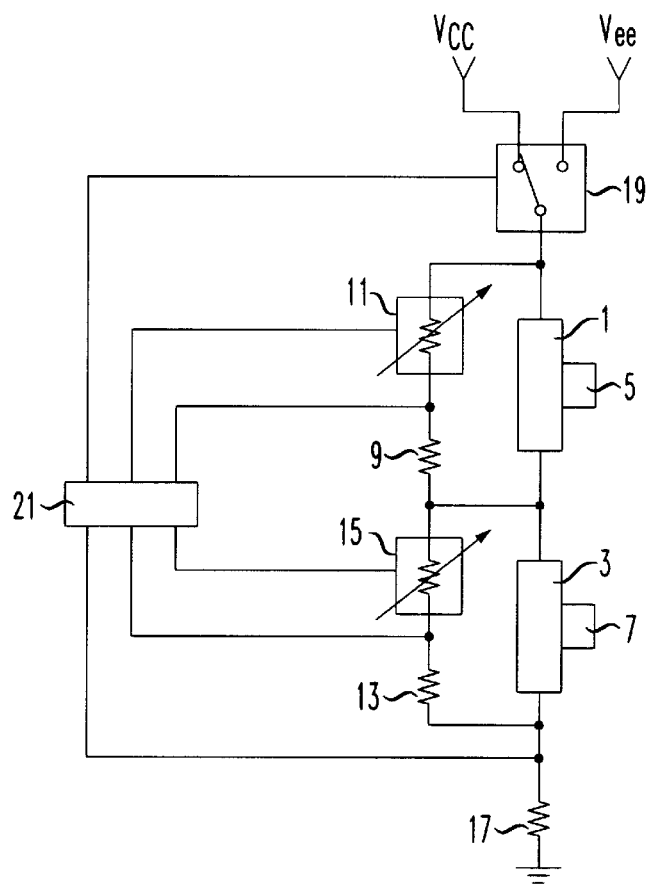
FIG. 1 is a schematic depiction of a thermoelectric cooled laser according to this invention.

The invention will be first described by reference to the exemplary embodiment of a series connected thermoelectric cooled laser module depicted in FIG. 1. Another embodiment using series connected lasers with be described with respect to FIG. 2. Variations and other embodiments will be apparent to those skilled in the art. Depicted are first and second thermoelectric coolers 1 and 3, respectively. The coolers are connected in series and mounted with lasers 5 and 7, respectively. First monitor resistance 9 and first shunt resistance 11 are series connected and connected in parallel with first thermoelectric cooler 1 and second monitor resistance 13 and second shunt resistance 15 are series connected and connected in parallel with second thermoelectric cooler 3. The first and second shunt resistances 11 and 15 are variable resistances. Third monitor resistance 17 is connected between second thermoelectric cooler 3 and a ground connection. Switch 19 is connected to the first thermoelectric cooler 1 and two voltage sources, Vcc and Vee, which are used for heating and cooling, respectively. A microcontroller 21 is connected as shown to the switch, first and second shunt resistances 11 and 15, respectively, and to the first, second, and third monitor resistances 9, 13, and 17, respectively. The electrical connections to the lasers are well known and are not shown for reasons of clarity.

The switch may be omitted if heating is not desired. Monitor resistance 17 is used to permit the total current to be measured.

Those skilled in the art will readily construct the module depicted after consideration of several comments the description of the operation of the module. The lasers 5 and 7 are typically semiconductor lasers such as those used in optical communications systems. Appropriate lasers will be readily selected. Microcontrollers are well known and an appropriate selection will readily be made. Thermoelectric coolers are also well known in the art and appropriate selection will be readily made.

The operation of the module will be described. The first and second shunt resistances 11 and 15 shunt the current away from the thermoelectric coolers 1 and 3. The first and second monitor resistances 9 and 13 are used to monitor how much current is shunted from the thermoelectric coolers 1 and 3. Three operating conditions or regimes can be considered. If it is desired that the currents through the two thermoelectric coolers 1 and 3 be equal, the first and second shunt resistances 11 and 15 are set to values that are sufficiently high that the resistances look like open circuits. If it is desired that the current through the first thermoelectric cooler 1 be less than the current through the second thermoelectric cooler 3, the second shunt resistance 15 is set to a value sufficiently high that it looks like an open circuit, and the first shunt resistance 11 is varied to shunt the current away from the first thermoelectric cooler 1. The lower the resistance 11 is, the higher the shunting current will be. If it is desired that the current through the first thermoelectric cooler 1 be greater than the current through the second thermoelectric cooler 3, the first shunt resistance 11 is set to a value sufficiently high that it looks like an open circuit, and the second shunt resistance 13 varied to shunt currents away from the second thermoelectric cooler 3.

The microcontroller 21 receives inputs from the monitor resistances and processes the data. Control signals are sent to the shunt resistances which are varied so that the proper amount of current flows through each thermoelectric cooler. The inputs to the microcontroller will be readily obtained by those skilled in the art. Proper signals to the shunt resistances will also be readily obtained from the microcontroller. The microcontroller 21 also sends signals to switch 19 as appropriate to switch the voltage between Vcc and Vee.

Figure 2:
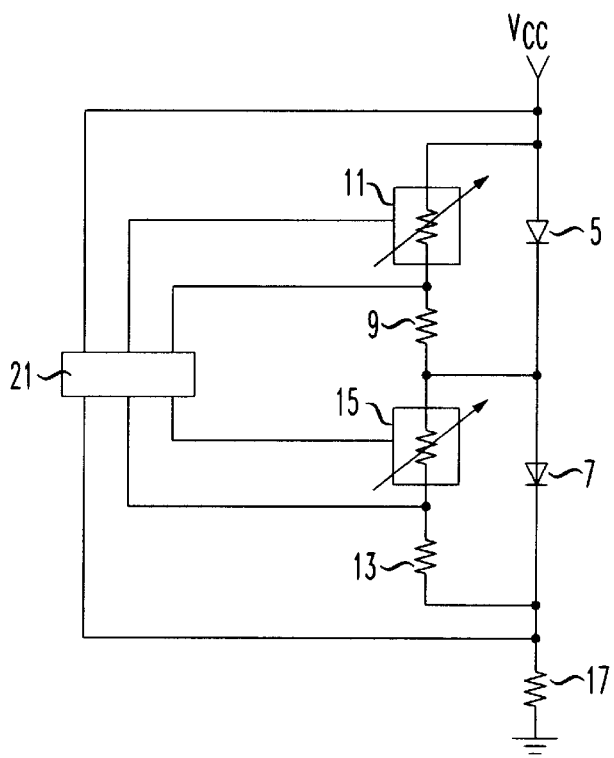
FIG. 2 is a schematic depiction of a dual laser according to this invention.

Another exemplary embodiment is depicted in FIG. 2. This embodiment depicts two series connected lasers 5 and 7. The current through the lasers is controlled as was the current through the thermoelectric coolers depicted in FIG. 1. Detailed description of the operation of this circuit is not required. Of course, the circuit described with respect to FIG. 1 may also be used with the circuit described with respect to FIG. 2.

It will be understood that the thermoelectric coolers in FIG. 1 and the lasers in FIG. 2 can be referred to generically as devices.

Variations in the embodiment described will be readily thought of by those skilled in the art. For example, although the invention has been described be reference to thermoelectric coolers, it will be appreciated that other cooling apparatus may be used. Additionally, although the embodiment described uses series connected monitor and shunt resistances connected in parallel with the thermoelectric cooler, a single variable resistance could be used. Furthermore, the third monitor resistance may be omitted in some embodiments if other methods are used to measure the total current. Lasers other than semiconductor lasers may also be used. Voltage sources may also be connected to the switch; sale of a module without voltage sources is possible.

We claim:

1. A laser module comprising:
   first and second thermoelectric cooling apparatus, said first and second cooling apparatus being connected in series;
   first and second variable resistances, and first and second variable resistances being connected in series and being connected in parallel with said first and second cooling apparatus, respectively; and
   a microcontroller connected to said first and second variable resistances and controlling said first and second variable resistances.

2. A laser module is recited in claim 1 further comprising first and second lasers, said first and second lasers being mounted with said first and second cooling apparatus, respectively.

3. A laser module as recited in claim 1 in which said first variable resistance comprises first monitor and shunt resistances, said monitor and shunt resistances being connected in series.

4. A laser module as recited in claim 3 in which said second variable resistance comprises second monitor and shunt resistances, said monitor and shunt resistances being connected in series.

5. A laser module as recited in claim 1 further comprising a third monitor resistance connected to said second cooling apparatus and to a ground connection.

6. A module as recited in claim 1 in which said lasers are semiconductor lasers.

7. A module as recited in claim 1 further comprising a switch and first and second voltage sources connected to said switch.

8. A module as recited in claim 1 in which said first and second devices comprise first and second lasers.

9. A module as recited in claim 8 in which said lasers comprise semiconductor lasers.

10. A laser module comprising:
    first and second lasers, said lasers being connected in series; first and second variable resistances, said first and second variable resistances being connected in series and being connected in parallel with said first and second lasers, respectively; and
    a microcontroller connected to said first and second variable resistances and controlling said first and second variable resistances.

11. A laser module as recited in claim 10 in which said first variable resistances comprises first monitor and shunt resistances, said monitor and shunt resistances being connected in series.

12. A laser module as recited in claim 11 in which said second variable resistance comprises second monitor and shunt resistances, said monitor and shunt resistances being connected in series.

* * * * *